(12) United States Patent
Graybill et al.

(10) Patent No.: US 9,097,523 B2
(45) Date of Patent: Aug. 4, 2015

(54) COMPASS CALIBRATION

(75) Inventors: Scott Jason Graybill, Christchurch (NZ); Farshad Nourozi, Rolleston (NZ); Shawn David Weisenburger, Denver, CO (US)

(73) Assignee: TRIMBLE NAVIGATION LTD., Sunnyvale, CA (US)

( * ) Notice: Subject to any disclaimer, the term of this patent is extended or adjusted under 35 U.S.C. 154(b) by 580 days.

(21) Appl. No.: 13/433,082

(22) Filed: Mar. 28, 2012

(65) Prior Publication Data
US 2013/0262011 A1 Oct. 3, 2013

(51) Int. Cl.
| | |
|---|---|
| G01C 17/38 | (2006.01) |
| G01C 25/00 | (2006.01) |
| G01R 33/02 | (2006.01) |
| G01P 21/00 | (2006.01) |
| G01R 33/00 | (2006.01) |

(52) U.S. Cl.
CPC .............. G01C 17/38 (2013.01); G01C 25/005 (2013.01); G01P 21/00 (2013.01); G01R 33/0035 (2013.01); G01R 33/02 (2013.01)

(58) Field of Classification Search
CPC ....................................................... G01C 17/38
USPC ............................................................. 702/96
See application file for complete search history.

(56) References Cited

U.S. PATENT DOCUMENTS

| | | | |
|---|---|---|---|
| 6,401,037 B1 | 6/2002 | Muller et al. | |
| 7,451,549 B1 * | 11/2008 | Sodhi et al. | 33/356 |
| 2009/0259424 A1 * | 10/2009 | Dutta et al. | 702/85 |

* cited by examiner

*Primary Examiner* — Bryan Bui
(74) *Attorney, Agent, or Firm* — K&L Gates LLP

(57) ABSTRACT

A system, method, and computer program product are provided for calibrating a sensor device, such as an accelerometer, gyroscope, and/or magnetometer. The sensor device provides measurements, and a determination if the sensor device is in a steady state is made based at least partly on the measurements. If the sensor device is in a steady state then measurement data is stored in a memory, and the sensor device is calibrated at least partly with the stored data. A set of such steady points is gathered with the sensor device in various spatial orientations, preferably with the steady point orientations spaced appropriately apart to ensure precise calibration throughout the range of possible orientations. Calibration parameters are determined by fitting the set of steady point measurements to an ellipsoid. Active audio and visual guidance may be provided to a user to assist with orienting the sensor device during calibration.

26 Claims, 4 Drawing Sheets

COMPASS CALIBRATION

FIELD OF THE INVENTION

The present patent document relates in general to sensor calibration, and more specifically to calibrating a magnetometer or accelerometer sensor triad.

BACKGROUND OF THE INVENTION

Portable sensor devices are becoming more widely used in a variety of fields. Such sensor devices may require correction of systematic errors, typically in the field prior to use. There are many specific reasons why a sensor device such as a magnetometer or accelerometer sensor triad may require calibration. It may be necessary for example to correct for scale factor, biases, or non-orthogonality of the three sensors making up a sensor triad. Alternatively, the temperature, local magnetic or gravitational field may change or there may be misalignment between two or more sensor triads due to manufacturing variations or limits of the technology. It is expected that calculating the desired result from calibrated data will yield better accuracy than merely using the raw sensor data.

This patent application provides a viable approach to solving this challenge and presents a practical implementation of that technique.

SUMMARY OF THE EMBODIMENTS

A system, method, and computer program product for calibrating a sensor device are disclosed and claimed herein. An exemplary computer-implemented method embodiment may comprise obtaining a measurement reading from the sensor device, determining if the sensor device is in a steady state based at least partly on the measurement reading, storing data obtained from the measurement reading in a memory if the sensor device is in the steady state, and calibrating the sensor device at least partly on the stored data.

The sensor device may comprise a magnetometer, an accelerometer, a gyroscope, and/or a temperature sensor. Determining if the sensor device is in a steady state may comprise determining if the difference between the measurement reading and an exponential moving average is less than a threshold. The sensor device may also be deemed to be in a steady state when moving at a constant velocity.

Once the sensor device is in a steady state, the method may further comprise determining at least one steady point at least partly from stored data obtained from at least two measurement readings. The steady point may be obtained by averaging the stored data obtained from the at least two measurement readings. The sensor device may further generate an audible notification upon determining a steady point. The steady point may be stored in a memory if the steady point is further than a threshold distance away from steady points already stored in the memory. Storage may depend on a score based at least partly on measured distances between the steady points and a set of defined target points.

The measurements may be obtained while the sensor device is manipulated into multiple spatial orientations, including while the sensor device is rotated around each of three rotational axes. Calibrating the sensor device may comprise fitting an ellipsoid to the collected steady points to produce calibration parameters.

A system embodiment may comprise a processor and a memory containing instructions that, when executed by the processor cause the processor to obtain a measurement reading from a sensor device, determine if the sensor device is in a steady state based at least partly on the measurement reading, store data obtained from the measurement reading in a memory if the sensor device is in the steady state, and calibrate the sensor device at least partly on the stored data.

A computer program product embodiment may comprise a computer readable medium tangibly embodying non-transitory computer-executable program instructions thereon that, when executed, cause a computing device to obtain a measurement reading from a sensor device, determine if the sensor device is in a steady state based at least partly on the measurement reading, store data obtained from the measurement reading in a memory if the sensor device is in the steady state, and calibrate the sensor device at least partly on the stored data.

As described more fully below, the apparatus and processes of the embodiments disclosed enable sensor device calibration. Further aspects, objects, desirable features, and advantages of the apparatus and methods disclosed herein will be better understood and apparent to one skilled in the relevant art in view of the detailed description and drawings that follow, in which various embodiments are illustrated by way of example. It is to be expressly understood, however, that the drawings are for the purpose of illustration only and are not intended as a definition of the limits of the claimed invention.

DETAILED DESCRIPTION OF EXEMPLARY EMBODIMENTS

Figure 1:
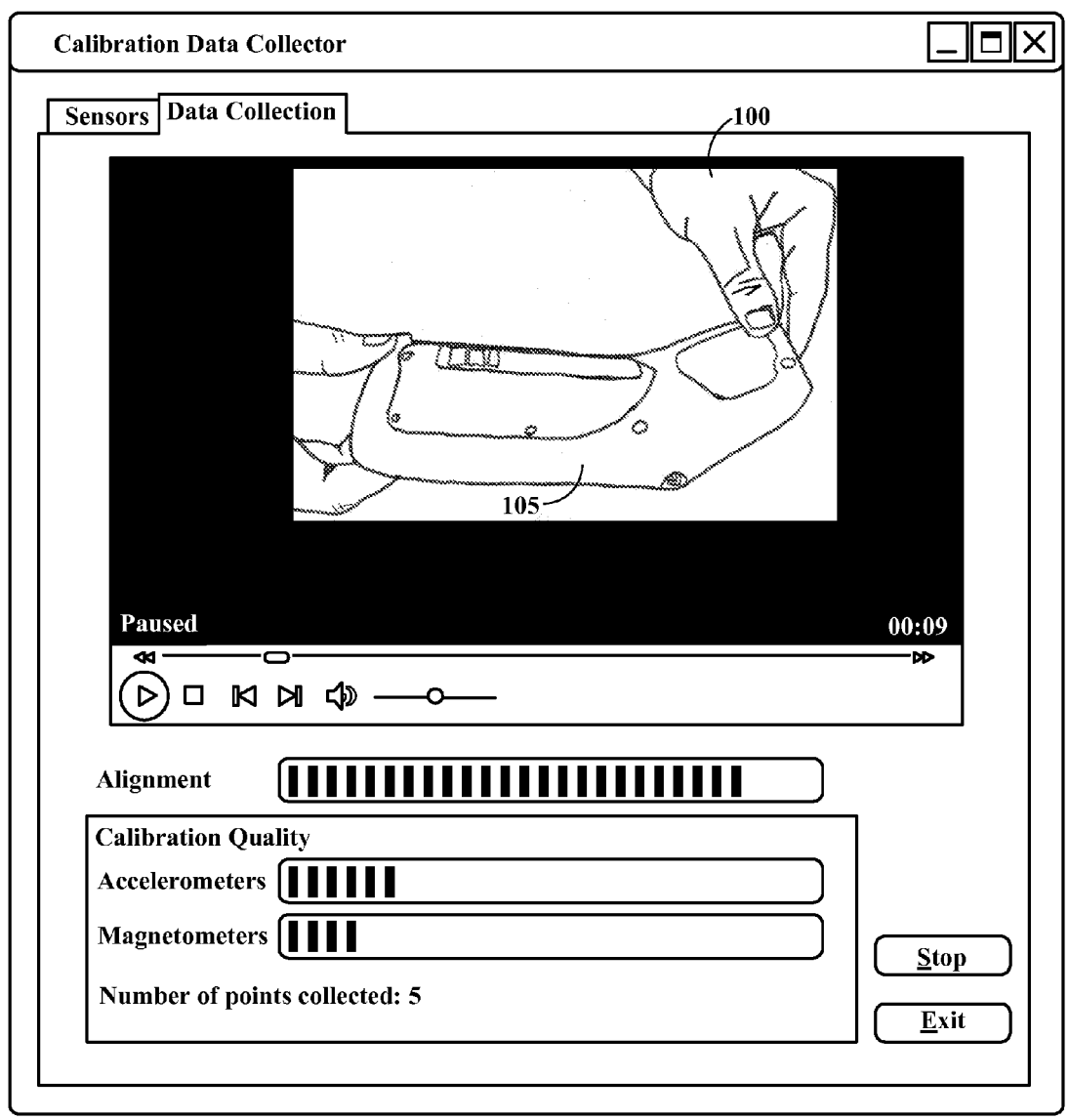
FIG. 1 depicts a user holding a sensor device for calibration, according to an embodiment.

Referring now to FIG. 1, the techniques described below involve a user 100 being guided to hold a sensor device 105 in various spatial orientations as shown. As will be described further, the techniques involve calculating what is referred to as a set of "steady points" and fitting an ellipsoid to the steady points. The techniques are based on the fact that the output vector from a well calibrated sensor triad will instead scribe a sphere as the sensor set is rotated. If the sensor triad is not well calibrated, the output vector will scribe an ellipsoid.

Figure 2:
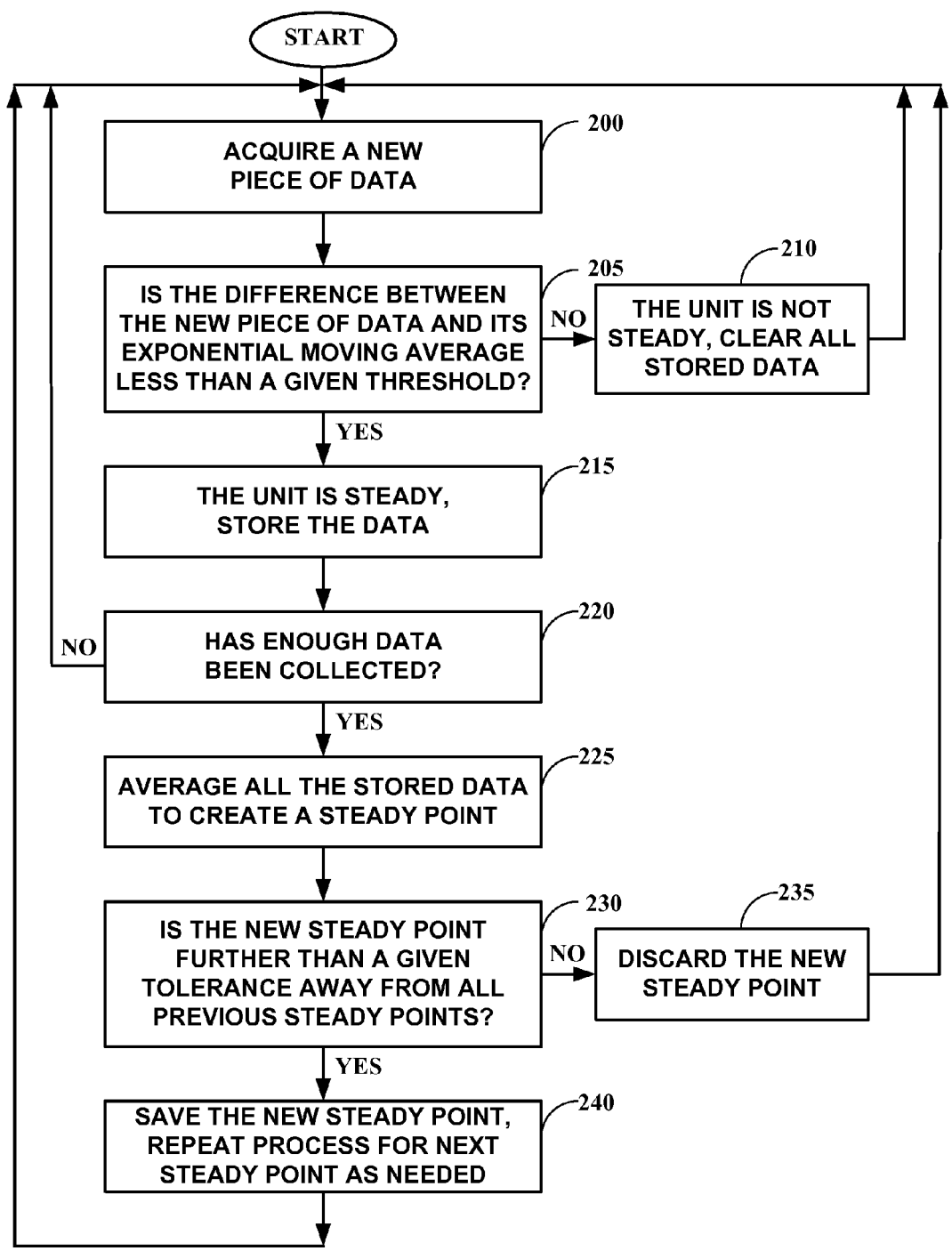
FIG. 2 depicts a flowchart for finding steady points for calibration of a sensor device, according to an embodiment.

A flowchart depicting an exemplary method of finding steady points for sensor device calibration is described with reference to FIG. 2. The method starts at step 200 with the collection of a new piece of data. This new piece of data is obtained from a measurement reading from the sensor device. A further check is performed at step 205 to determine whether the sensor device is in a steady state.

The term "steady state" in this context is defined as the condition where the outputs of the sensors are expected to be stable. Accelerometer stability is achieved when the sensor device is not subject to any non-gravitational acceleration. Magnetic sensor stability is Achieved when the sensor device is not changing orientation.

The sensor device is expected to be in a steady state when the sensor device is stationary. However, the sensor device does not have to be absolutely stationary to be in a steady state. For example, the sensor device is determined in step 205 to be in a steady state if the absolute difference between the current measurement and its exponential moving average is less than the expected noise level for that axis of the sensor device. The expected noise level for that particular sensor hardware is typically determined once, at the factory. In one embodiment, the steady state could include a state where the sensor device is moving at a constant velocity.

If the difference is greater than a given threshold then the sensor device is determined in step 210 to not be in a steady state. All previously collected data is cleared from the device and a new measurement is obtained back at step 200. On the other hand, if the difference is less than a given threshold then the sensor device is determined in step 215 to be in a steady state and the data is stored.

Several such points may be collected as shown at step 220 where it is determined whether enough data has been collected. If enough data has not been collected then new data is collected as shown at step 200. Otherwise, the technique proceeds to step 225 in which the stored data points are averaged to create what is referred to as a "steady point". It is preferable to create the steady point by averaging sensor measurements because averaging reduces the effect of sensor noise on the validity of the steady point. There is a trade-off between the number of samples per steady point and the speed at which a steady point can be collected.

The number of samples taken is configurable and depends on the mode of operation, with more points generally taken for the calibration process than for normal operation. The number of samples taken is also dependent on the sensor data rate output and the expected noise level. Generally, the aim is to collect data during calibration to allow at least one steady point to be reached every couple of seconds, and at least 10 steady points per second during normal operation.

When the sensor device is held steady (i.e. whether held stationary or moving at a constant velocity) for a prolonged time, it is preferred that only one steady point is collected in that orientation. A further check is made as shown at step 230 as to whether the new steady point is from a spatial orientation that is far enough away from the spatial orientations of previously calculated steady points. This involves comparing the distance between a new steady point and at least one of the steady points that have so far been collected.

If the shortest distance is less than a given steady point threshold spacing value, then this new steady point is not unique and is therefore discarded. This is shown at step 235. On the other hand, if the steady point is further than a given tolerance away from previously stored steady points, then the new steady point is saved at step 240. It will be appreciated that reducing the threshold spacing value permits collection of steady points that are closer together. The threshold spacing value may be configured depending on the mode of operation, e.g. steady points are typically taken 15 degrees apart during data collection for accelerometer and magnetometer calibration, but may be only 2 degrees apart when only magnetometers are being calibrated. The entire calibration process typically takes 60-90 seconds if both magnetometers and accelerometers are being calibrated, but only 10-15 seconds if only magnetometers are being calibrated.

As described above, obtaining a good coverage of the sample orientation sphere requires the sensor device to be rotated through a range of spatial orientations. For better coverage, the sensor device is preferably rotated completely about a given axis at least once, and the rotation process is then repeated for at least two other axes. In many cases the screen or display of the sensor device is not visible to the user during rotation. Therefore, reliable visual feedback of capture of a valid steady point is not always possible. In one embodiment, the sensor device is programmed to emit an audible notification to confirm capture of a valid steady point. This audible notification signals to the user that a further steady point has been determined.

Calibration involves' comparing calculated measurements with known measurements. Techniques described below compare the collected steady points to a set of defined target points.

One preferred technique calculates a coverage indicator which returns a score between 0 and 1 based on the closeness of the steady points to a set of defined target points. When a steady point is collected, the distance between the steady point and the closest target point is calculated. The score for that target point is increased based on the following formula by way of example:

$$Score_{added} = \frac{D_{max} - D_{current}}{D_{max}} \times (Score_{max} - Score_{current})$$

In the above formula:
  $Score_{added}$ is the score to be added to the current score
  $D_{max}$ is the maximum possible distance between a steady point and a target point
  $D_{current}$ is the distance between the current steady point and the closest target point
  $Score_{max}$ is a maximum possible score
  $Score_{current}$ is a current store of the target point.
The overall coverage factor for each sensor is calculated based on scores of all the target points as shown in the following formula $$Quality = \frac{\sum_{i=1}^{n} Score_i}{n \times Score_{max}}$$

In the formula, n is the number of target points.

Collection of more than the required number of points to increase the coverage is preferable. Maximum coverage or a high coverage indicator score is achieved when all target points have an exactly matching steady point.

Having collected a set of steady points and compared them with a set of target points, the technique then fits an ellipsoid to the calculated steady points. Preferably, the technique minimizes a general quadratic form subject to the constraint that the quadratic form must be an ellipsoid. The calibration parameters may then be calculated from the ellipsoid parameters.

The ellipsoid parameters, c, may be calculated from the general eigenvalue equation:

$$D^T Dc = \lambda Cc,$$

In the equation above, D is computed from the steady points and C is the constraint matrix. The solution corresponds to the eigenvector with the largest real eigenvalue. The calibration parameters may then be calculated from c.

The quality of the calibration and calibrated measurements may be poor in magnetically disturbed environments. Such environments may be detected by monitoring the angle between the accelerometer vector and the magnetometer vector output by the sensor device. If the sensor device is held stationary, then this monitored angle should remain relatively constant unless the environment has been magnetically disturbed. An expected value for this angle may be derived from the World Magnetic Model given the geographic position of the sensor device or the calculated and saved angle at the time of calibration. If the monitored angle changes by more than a specified threshold then the orientation may be presented to the user in a different color.

The magnitude of the magnetic vector should also remain relatively constant in an undisturbed environment. If the magnitude of the magnetic vector changes by more than a given tolerance then the orientation may also be presented to the user in a different color. The tolerance of the magnetic vector is configurable and is applied to the calibrated magnetic vector. It is expected that once the calibration is applied to the magnetic vector, its magnitude should be normalized to one; deviation from one is indication of magnetic disturbance. A five percent deviation is a typical tolerance value.

In a further embodiment, the user may be guided through the calibration process by a programmed processor. The sensor device is physically or wirelessly in communication with the processor. The required orientations are preferably simple to achieve and do not involve angles that are hard to describe and reproduce. Furthermore, as points are collected, there is preferably an indication of how well the collected points match the orientation of the target points.

The user is preferably shown an audiovisual file depicting the required orientation for a given target point, e.g. via the user interface. The video may pause at a frame corresponding to the orientation required for such a target point. Once the user holds the sensor device steady at the shown orientation, a steady point related to the target point is collected. The video will then automatically resume playing until it is paused at the next required orientation. It is preferred that the process continues until all target points have been collected.

Figure 3:
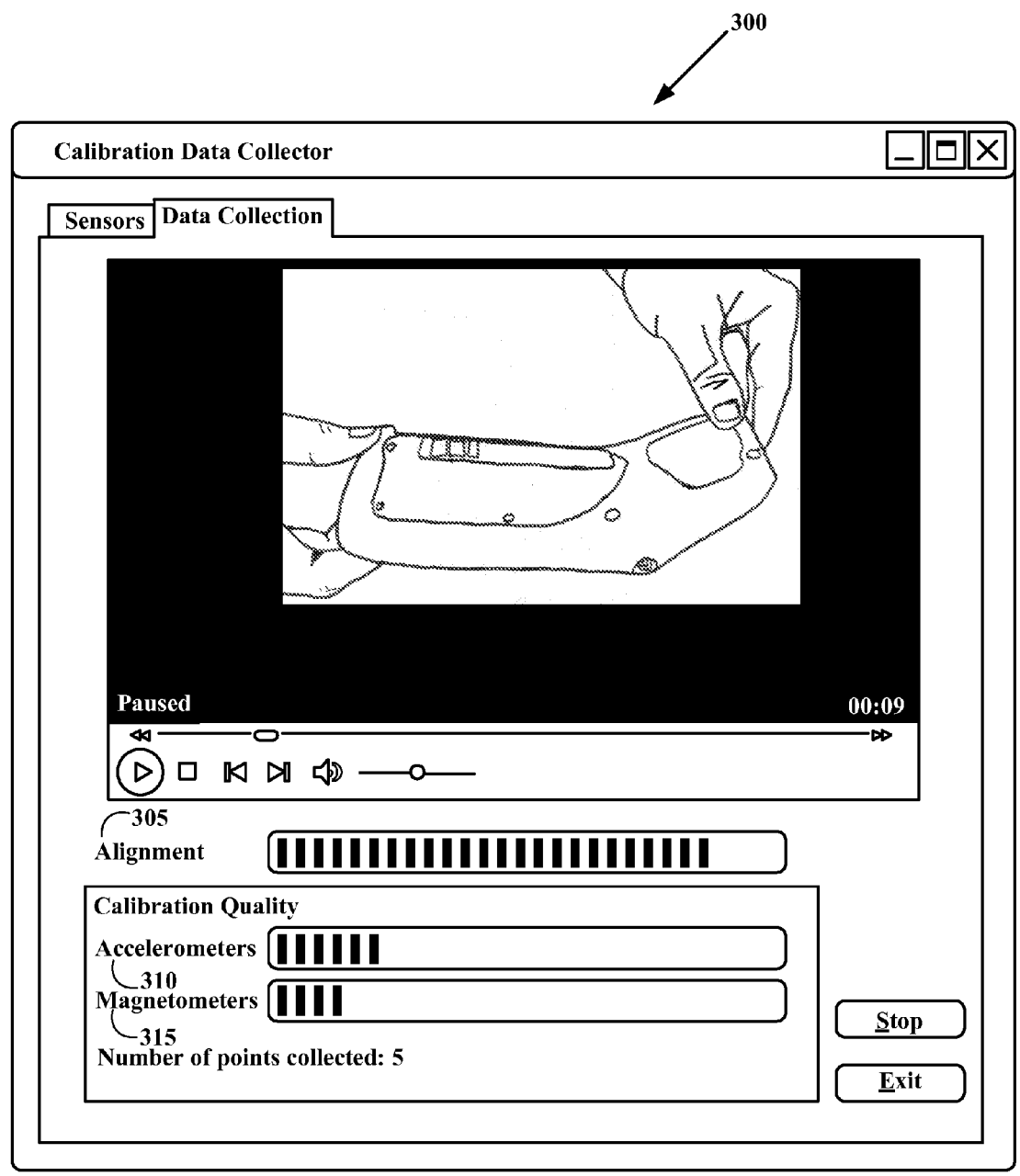
FIG. 3 depicts an sensor device user interface including an alignment progress bar, according to an embodiment.

Referring now to FIG. 3, an exemplary embodiment of user interface 300 includes an alignment progress bar 305. This progress bar shows how close the current sensor device orientation is to the required orientation. The user is able to use this information to fine tune the orientation of the sensor device to what is shown on the paused video, until collection of the point is achieved and video play is resumed.

There are preferably two progress bars, an accelerometer sensor progress bar 310 and a magnetometer sensor progress bar 315. These are provided to show the quality of the steady points collected so far for each of the sensors in the sensor device. The intention is for the user to increase the quality as more points are collected.

It is expected that the video shows the minimum recommended orientations for which steady points need to be collected. This would generally provide very good coverage for the accelerometer. However, depending on the geographical location where the calibration is performed, less than desirable quality may be achieved for the magnetic sensors. This is due to the fact that the suggested orientations are optimized for good coverage for the known direction of the gravity vector.

Since the magnetic vector has a different inclination angle, the suggested orientations at places with a small inclination angle provide suboptimal quality steady points for calibration of the magnetic sensors. One solution to this issue is to instruct the user to face approximately north or south. Initial simulation results show that for absolute inclination angles greater than 15 degrees, the suggested orientations provide good coverage regardless of the direction the user is facing.

In one embodiment, the minimum number of collected points is 18. If after these 18 suggested points are collected, the quality of the magnetic sensor as shown by the progress bar is not high, additional points may be collected. An additional 8 point collection is preferably performed with the sensor device lying flat on a horizontal surface. This process will not add to the quality of the accelerometer calibration but will increase the quality of the magnetic sensor calibration data.

Figure 4:
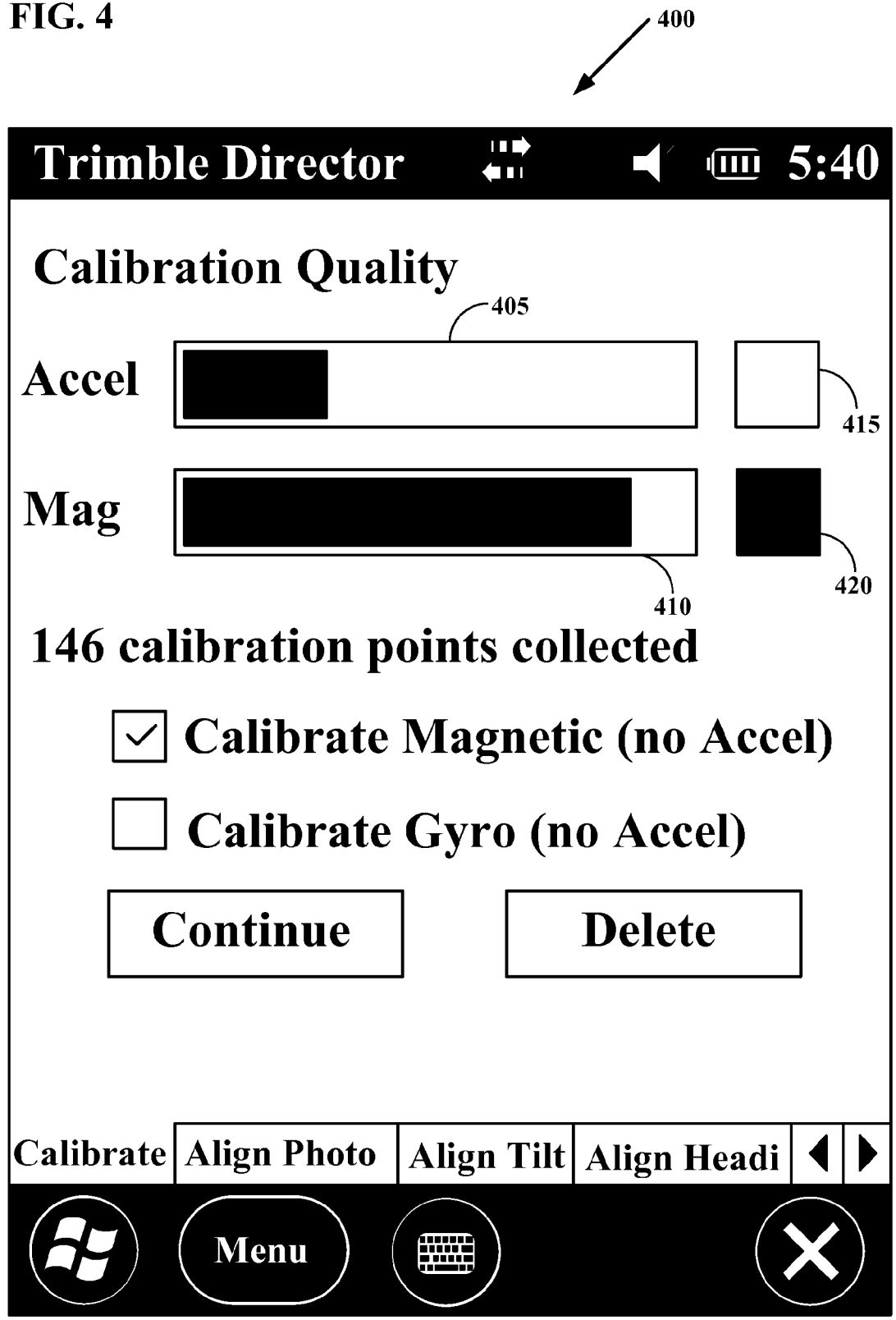
FIG. 4 depicts an alternative sensor device user interface, according to an embodiment.

Referring now to FIG. 4, an alternative embodiment of user interface 400 is shown. As described above, there are two progress bars, an accelerometer sensor progress bar 405 and a magnetometer sensor progress bar 410. Once again, these are provided to show the quality of the steady points so far collected for each of the sensors. The intention is to increase the quality as more points are collected by the user.

This user interface includes a pair of color coded quality indicators 415 and 420 corresponding to sensors 405 and 410. Indicators 415 and 420 may be colored with a color from a range of colors representing the quality of the calculated calibration parameters. For example, in one embodiment red is low quality, yellow is average and green is good quality. Colors are determined by comparing the orthogonality parameter as calculated by the calibration procedure described above for each axis of each sensor against a set of thresholds. The color indicators may also encompass grayscale indicia.

As used herein, the terms "a" or "an" shall mean one or more than one. The term "plurality" shall mean two or more than two. The term "another" is defined as a second or more. The terms "including" and/or "having" are open ended (e.g., comprising). Reference throughout this document to "one embodiment", "certain embodiments", "an embodiment" or similar term means that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics may be combined in any suitable manner on one or more embodiments without limitation. The term "or" as used herein is to be interpreted as inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

In accordance with the practices of persons skilled in the art of computer programming, embodiments are described below with reference to operations that are performed by a computer system or a like electronic system. Such operations are sometimes referred to as being computer-executed. It will be appreciated that operations that are symbolically represented include the manipulation by a processor, such as a central processing unit, of electrical signals representing data bits and the maintenance of data bits at memory locations, such as in system memory, as well as other processing of signals. The memory locations where data bits are maintained are physical locations that have particular electrical, magnetic, optical, or organic properties corresponding to the data bits.

When implemented in software, the elements of the embodiments are essentially the code segments to perform the necessary tasks. The non-transitory code segments may be stored in a processor readable medium or computer readable medium, which may include any medium that may store or transfer information. Examples of such media include an electronic circuit, a semiconductor memory device, a read-only memory (ROM), a flash memory or other non-volatile memory, a floppy diskette, a CD-ROM, an optical disk, a hard disk, a fiber optic medium, etc. User input may include any combination of a keyboard, mouse, touch screen, voice command input, etc. User input may similarly be used to direct a browser application executing on a user's computing device to one or more network resources, such as web pages, from which computing resources may be accessed.

While the invention has been described in connection with specific examples and various embodiments, it should be readily understood by those skilled in the art that many modifications and adaptations of the embodiments described herein are possible without departure from the spirit and scope of the invention as claimed hereinafter. Thus, it is to be clearly understood that this application is made only by way of example and not as a limitation on the scope of the invention claimed below. The description is intended to cover any variations, uses or adaptation of the invention following, in general, the principles of the invention, and including such departures from the present disclosure as come within the known and customary practice within the art to which the invention pertains.

What is claimed is:

1. A computer-implemented method for calibrating a sensor device, comprising:
    obtaining, by a device, a measurement reading from the sensor device, wherein the measurement reading is a output signal from the sensor device to determine movement;
    determining, by the device, if the sensor device is in a steady state based at least partly on the measurement reading, wherein the steady state is a condition where the output signal of the sensor device is expected to be stable and wherein stability of the sensor device is determined by not being subject to movement;
    storing, by the device, data obtained from the measurement reading in a memory if the sensor device is in the steady state; and
    calibrating, by the device, the sensor device at least partly on the stored data, wherein calibrating comprises fitting an ellipsoid to collected steady points to produce calibration parameters.

2. The method of claim 1 wherein the sensor device is determined to be in the steady state if the difference between the measurement reading and an exponential moving average is less than a threshold.

3. The method of claim 2 wherein the steady state includes the sensor device moving at a constant velocity.

4. The method of claim 1, further comprising determining at least one steady point at least partly from stored data obtained from at least two measurement readings.

5. The method of claim 4 wherein the steady point is obtained by averaging the stored data obtained from the at least two measurement readings.

6. The method of claim 4 further comprising generating an audible notification upon determining a steady point.

7. The method of claim 4 further comprising storing the steady point in a memory if the steady point is further than a threshold distance away from steady points already stored in the memory.

8. The method of claim 7 further comprising determining a score based at least partly on measured distances between the steady points and a set of defined target points.

9. The method of claim 1 wherein the sensor device comprises at least one of a magnetometer, an accelerometer, a gyroscope, and a temperature sensor.

10. The method of claim 1 wherein the measurements are obtained while the sensor device is placed into multiple spatial orientations.

11. The method of claim 10 wherein the measurements are obtained while the sensor device is rotated around each of at least three rotational axes.

12. The method of claim 1 wherein the ellipsoid are parameters to calculated a solution to correspond to the eigenvector with the largest eigenvalue.

13. A system for calibrating a sensor device, comprising:
    a processor; and
    a memory containing instructions that, when executed by the processor cause the processor to:
        obtain, by a device, a measurement reading from the sensor device, wherein the measurement reading is a output signal from the sensor device to determine movement;
        determine, by the device, if the sensor device is in a steady state based at least partly on the measurement reading, wherein the steady state is the condition where the output signal of the sensor device is expected to be stable and wherein stability of the sensor device is determined by not being subject to movement;
        store data, by the device, obtained from the measurement reading in a memory if the sensor device is in the steady state; and
        calibrate, by the device, the sensor device at least partly on the stored data, wherein calibrating comprises fitting an ellipsoid to collected steady points to produce calibration parameters.

14. The system of claim 13 wherein the processor determines the sensor device is in the steady state if the difference between the measurement reading and an exponential moving average is less than a threshold.

15. The system of claim 14 wherein the steady state includes the sensor device moving at a constant velocity.

16. The system of claim 13, wherein the processor further determines at least one steady point at least partly from stored data obtained from at least two measurement readings.

17. The system of claim 16 wherein the steady point is obtained by averaging the stored data obtained from the at least two measurement readings.

18. The system of claim 16 wherein the processor further generates an audible notification upon determining a steady point.

19. The system of claim 16 wherein the processor further stores the steady point in a memory if the steady point is further than a threshold distance away from steady points already stored in the memory.

20. The system of claim 19 wherein the processor further determines a score based at least partly on measured distances between the steady points and a set of defined target points.

21. The system of claim 13 wherein the sensor device comprises at least one of a magnetometer, an accelerometer, a gyroscope, and a temperature sensor.

22. The system of claim 13 wherein the measurements are obtained while the sensor device is in multiple spatial orientations.

23. The system of claim 22 wherein the measurements are obtained while the sensor device is rotated around each of at least three rotational axes.

24. The system of claim 13 wherein the ellipsoid parameters are calculated to correspond to the eigenvector with the largest eigenvalue.

25. A computer program product for calibrating a sensor device, comprising a non-transitory computer readable medium tangibly embodying non-transitory computer-executable program instructions thereon that, when executed, cause a computing device to:
    obtain, by a device, a measurement reading from the sensor device, wherein the measurement reading is a output signal from the sensor device to determine movement;

determine, by the device, if the sensor device is in a steady state based at least partly on the measurement reading, wherein the steady state is the condition where the output signal of the sensor device is expected to be stable and wherein stability of the sensor device is determined by not being subject to movement;

store, by the device, data obtained from the measurement reading in a memory if the sensor device is in the steady state; and calibrate, by the device, the sensor device at least partly on the stored data, wherein calibrating comprises fitting an ellipsoid to collected steady points to produce calibration parameters.

26. A system for calibrating a sensor device, comprising:

means for obtaining, by a device, a measurement reading from the sensor device, wherein the measurement reading is a output signal from the sensor device to determine movement;

means for determining, by the device, if the sensor device is in a steady state based at least partly on the measurement reading, wherein the steady state is the condition where the output signal of the sensor device is expected to be stable and wherein stability of the sensor device is determined by not being subject to movement;

means for storing, by the device, data obtained from the measurement reading in a memory if the sensor device is in the steady state; and means for calibrating, by the device, the sensor device at least partly on the stored data, wherein calibrating comprises fitting an ellipsoid to collected steady points to produce calibration parameters.

\* \* \* \* \*